(12) United States Patent
Runyon et al.

(10) Patent No.: US 6,567,958 B1
(45) Date of Patent: *May 20, 2003

(54) INVENTION TO ALLOW HIERARCHICAL LOGICAL-TO-PHYSICAL CHECKING ON CHIPS

(75) Inventors: Stephen Larry Runyon, Pflugerville, TX (US); Joseph Roland Verock, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/514,564

(22) Filed: Feb. 28, 2000

(51) Int. Cl.[7] .................................................. G06F 9/45
(52) U.S. Cl. .............................................. 716/5; 716/4
(58) Field of Search ...................................... 716/4, 5

(56) References Cited

U.S. PATENT DOCUMENTS 6,009,251 A * 12/1999 Ho et al. ........................ 716/5
6,115,546 A * 9/2000 Chevallier et al. ............. 716/1

* cited by examiner

Primary Examiner—John F. Niebling
Assistant Examiner—Stacy Whitmore
(74) Attorney, Agent, or Firm—Casimer K. Salys; Bracewell & Patterson, L.L.P.

(57) ABSTRACT

Layout cells having the same name as a corresponding schematic are checked hierarchically, with a single instance of a particular layout cell being checked internally for compliance with design rules and the like while remaining instances are merely checked for proper connection to neighboring cells. Layout cells which are not named the same as any schematic are automatically exploded for flat checking at the transistor level. Thus hierarchical checking is preserved for those layout cell instances named for the corresponding schematic, which should be the large majority of cell instances in any given integrated circuit, while cell instances meeting special layout requirements, which should be a small number of cases, are supported for any given schematic.

20 Claims, 3 Drawing Sheets

INVENTION TO ALLOW HIERARCHICAL LOGICAL-TO-PHYSICAL CHECKING ON CHIPS

RELATED APPLICATIONS

The present invention is related to the subject matter of the following commonly assigned, U.S. patent application Ser. No. 09/514,563 entitled "Invention to Allow Multiple Layouts for a Schematic in a Hierarchical Logical-to-Physical Checking on Chips" and filed Feb. 28, 2000. The content of the above-referenced application is incorporated herein by reference.

BACKGROUND OF THE INVENTION

1. Technical Field

The present invention relates generally to integrated circuit design software and in particular to design checking functionality within comprehensive integrated circuit design systems. Still more particularly, the present invention relates to enabling layout design checking capabilities to efficiently handle multiple physical layouts for a given schematic cell.

2. Description of the Related Art

Integrated circuits are generally designed as a conglomeration of "cells," logical subdivisions of the total circuit design which may be nested hierarchically so that top level cells are subdivided into other cells, which may be further subdivided in lower levels. Cells at any level may be formed as a composite of lower level cells and subcells. As a simple example, a particular integrated circuit may include a clock generator for generating multi-phase clock signals, with the clock generator being formed from a plurality of inverters and NAND or NOR gates. The clock generator may be treated logically as a single cell at one level, subdivided into separate cells for the inverters and gates at the next lower level.

Integrated circuit design software typically includes both electrical circuit schematic layout and physical layout capabilities operating in a coordinated manner. Generally included are checking functions for checking the schematic design and circuit operation, as well as the physical layout design. For checking physical layouts, hierarchical checking techniques would be preferable to conventional flat checking techniques. In flat checking, each cell is checked individually for compliance with process restrictions and design rules (such as contact spacing and/or enclosure rules) regardless of the number of times which the same layout design is reused in different locations. In hierarchical checking, however, a specific layout design utilized in multiple locations is checked internally only once for compliance with design rules, and is then merely checked for proper connections at subsequent locations. For self-evident reasons, hierarchical checking allows greatly improved checking times and memory usage over conventional flat checking, but at the expense of some restrictions and drawbacks.

One restriction necessary to enable hierarchical checking is strict conformity of physical layouts in every instance of a given cell to a defined physical layout for the cell, allowing a check of the defined physical layout for the cell to serve as a check for each cell instance. This may be ensured, for example, by unique naming of each physical layout, requiring that the physical layout design of any distinct layout cell—including physical layout variations of the same schematic layout cell—be uniquely named. Such variations of the physical layout design for a cell may be required, for instance, due to the different layout requirements from neighboring cells at different locations—that is, required connections to neighboring cells may compel reversal of the physical layout or alteration of the different number of data input or output signals.

Hierarchical checking of a layout cell which has the same name as the schematic in one location but a different layout cell name (or another different attribute) in another location may result in a false error. Where the schematic cell name does not match the layout cell name, checking functionality will place the schematic cell name into an "explode list," causing all occurrences of that cell to be exploded into the detailed layout and checked flat at the transistor or device level. In the case of a frequently used cell such as a clock driver, hundreds or even thousands of instances of the standard layout cell—the layout cell with the name matching the corresponding schematic cell name—may exist. Exploding all of those instances due to a few instances of a special layout cell also corresponding to the schematic cell results in much unnecessary checking, the run time and memory usage and also resulting in poor diagnostics.

An alternative to exploding every instance of the mismatched cell is to copy the original schematic cell to the name of the new or special layout cell. However, this forces schematic changes late in the design cycle and necessitates rerunning of many schematic checking tools, timing tools, test generation tools, etc. since normally the schematic design and schematic checking are all completed before beginning layout. Normal design methodology would require that many tools be run against the schematic before layout is even started, assuring that the circuit design implements the correct function, generating early timing rules and test generation rules, performing electrical checks, and the like. Once checked, the schematic is then "frozen" and layout begins. Since the need for an alternative layout cell corresponding to a given schematic may not be discovered until layout is in progress, introduction of a new schematic cell named to match the alternative layout would necessitate rerunning of all schematic checking tools to satisfy stringent design checking requirements normally applied. The use of a separate schematic for the alternative layout also increases data volume and, in the case of an updated to the original schematic, allows the possibility of overlooking the new, differently-named version of the schematic and failure to make the required change to that cell as well as the original.

A third alternative is to allow a list of layout cell names to be attached to a schematic cell, where each of the cells is a different physical layout of the same electrical circuit. However, it frequently occurs that initially only one layout cell is envisioned for a particular schematic. Later, in the course of layout, it may be discovered that two or more layout designs may be required for a given cell to allow for different boundary conditions within different instances of the layout cell as described above, for example. A change to the schematic cell to add the name of the new layout cell would then be necessary. As noted above, it is exceedingly inconvenient and time consuming to modify the schematic after layout has begun since any modification—even merely adding a new layout cell name to the list of layout designs corresponding to a given schematic—changes audit records and forces tools to be rerun to satisfy the stringent design checking procedures typically employed in contemporary integrated circuit design.

It would be desirable, therefore, to allow layout design checking functionality to efficiently handle multiple physical layouts for a given schematic cell within an integrated circuit design, even when the need for one or more alternative layouts for a particular cell is not identified until layout is in progress.

SUMMARY OF THE INVENTION

It is therefore one object of the present invention to provide improved integrated circuit design software.

It is another object of the present invention to provide improved design checking functionality within comprehensive integrated circuit design systems.

It is yet another object of the present invention to enable layout design checking capabilities to efficiently handle multiple physical layouts for a given schematic cell.

The foregoing objects are achieved as is now described. Layout cells having the same name as a corresponding schematic are checked hierarchically, with a single instance of a particular layout cell being checked internally for compliance with design rules and the like while remaining instances are merely checked for proper connection to neighboring cells. Layout cells which are not named the same as any schematic are automatically exploded for flat checking at the transistor level. Thus hierarchical checking is preserved for those layout cell instances named for the corresponding schematic, which should be the large majority of cell instances in any given integrated circuit, while cell instances meeting special layout requirements, which should be a small number of cases, are supported for any given schematic.

The above as well as additional objectives, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
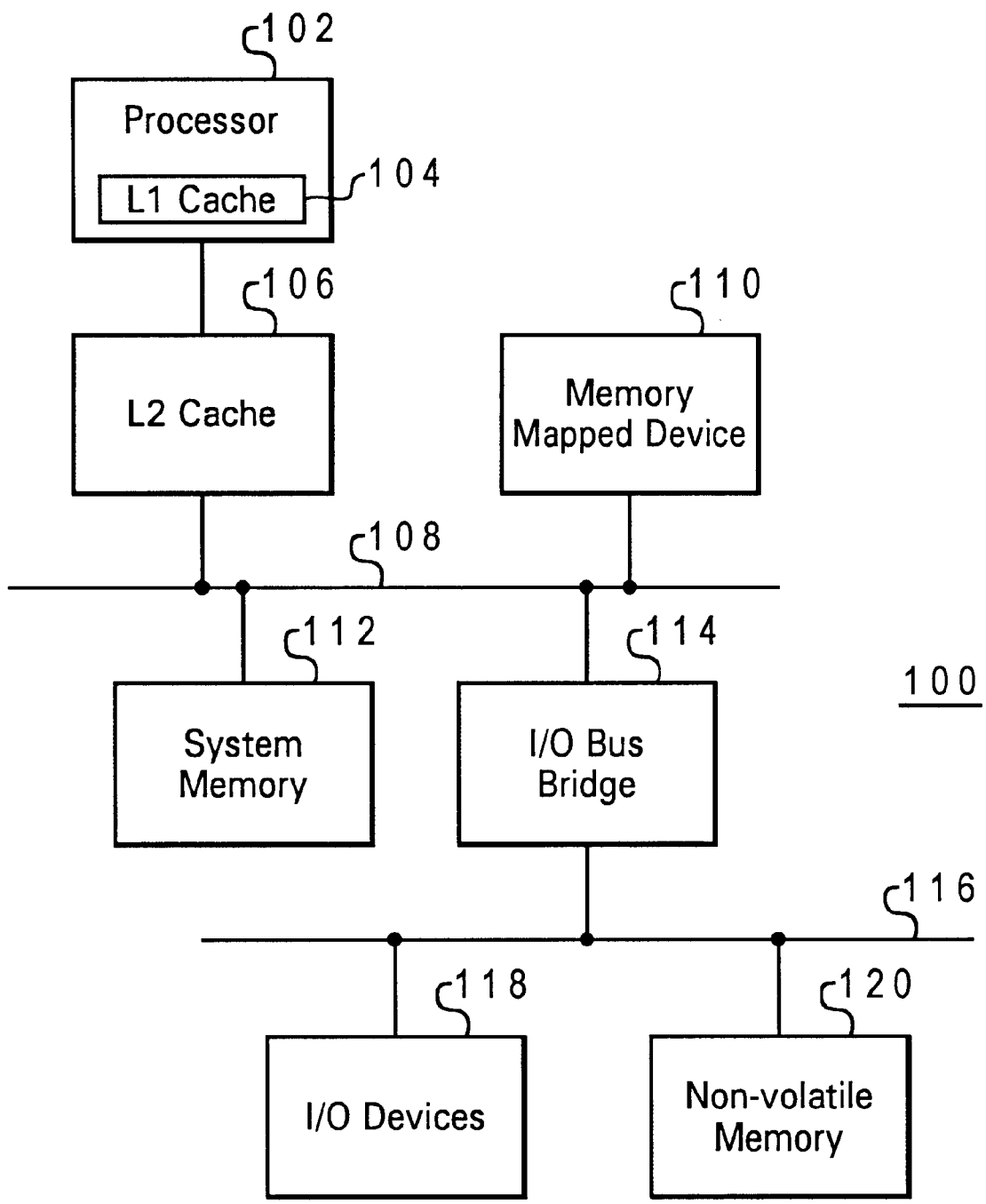
FIG. 1 depicts a data processing system in which a preferred embodiment of the present invention may be implemented.

With reference now to the figures, and in particular with reference to FIG. 1, a data processing system in which a preferred embodiment of the present invention may be implemented is depicted. Data processing system 100 includes a processor 102, which in the exemplary embodiment includes a level one (L1) cache 104 and is connected via a level two (L2) cache 106 to a system bus 108. Also connected to system bus 108 in the exemplary embodiment is a memory-mapped device 110, such as a graphics adapter connected to a display (not shown), a system memory 112, and a input/output (I/O) bus bridge 114.

I/O bus bridge 114 connects system bus 108 to I/O bus 116. Connected to I/O bus 116 are I/O devices 118 such as a keyboard, mouse or other pointing device, and the like, as well as nonvolatile memory 120, such as a hard disk drive and/or CD-ROM or DVD drive. Various other components may be included within data processing system 100, the operation of which is well known in the art and includes an operating system and, in the present invention, an integrated circuit design application having the functionality described below.

Figure 2:
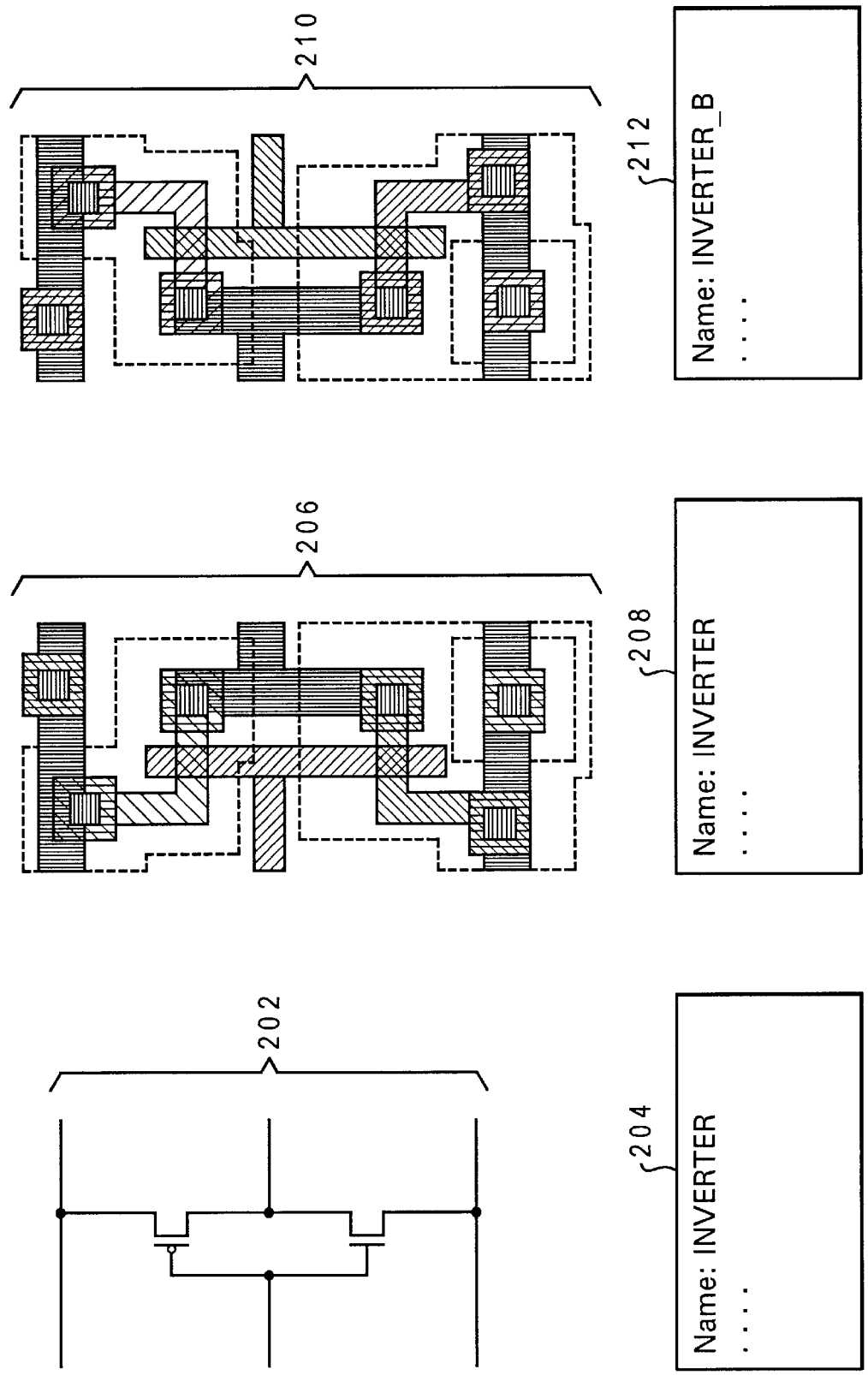
FIG. 2 is a schematic circuit and corresponding physical layouts for an integrated circuit cell in accordance with a preferred embodiment of the present invention.

Referring to FIG. 2, a schematic circuit and corresponding physical layouts for an integrated circuit cell in accordance with a preferred embodiment of the present invention are illustrated. Schematic circuit 202 for the subject cell is defined by schematic cell data 204, includes the name of the cell and contains a description of the circuit elements and connections forming the subject cell. Schematic cell data 204 may optionally be associated with a list of layout cell names (not shown) for different layout designs corresponding to schematic circuit 202.

Layout 206 corresponds to schematic circuit 202 and is defined by layout cell data 208 containing a description of the physical layout of integrated circuit structures forming the circuit portion of the subject cell. Layout cell data 208 also includes a cell name matching the cell name for schematic cell data 204 (or, alternatively, matching a layout cell name within the list of corresponding layout cell names associated with schematic cell data 204). At the time of layout checking, schematic 202 has already been checked and tested and is "frozen" against subsequent changes. The first instance of layout 206 which is encountered during layout checking is checked against design rules at every level, including any subcells, down to the transistor level. Connections between the first instance of layout 206 and any neighboring cells are also checked.

After the first instance of layout 206 is checked and found to comply with all applicable design rules, subsequent instances of layout 206 are not internally checked against the design rules, but instead are merely checked for proper connection to any neighboring cells. A running list of layout cell names for successfully checked layout cell designs may be maintained by the layout design checking process. Thus layout 206 need not be repetitively checked across all instances within an integrated circuit design, which may number in the hundreds or thousands.

Layout 210 is an alternative layout design for schematic 202, in this case a mirror image of layout 206 providing different boundary connections for input and output signals. Typically layout 210 will be designed to satisfy special layout needs and will be implemented in only a small number of instances of cells corresponding to schematic 202, with layout 206 being employed for the large majority of instances of such cells. Layout 210 is defined by layout cell data 212 and should contain a different cell name than the cell name of schematic 202, which is employed for layout 206. Unique naming of different layout designs is preferably required within the present invention. (The cell name for layout 210 is also presumed not to be within the list of corresponding layout cell names associated with schematic cell data 204).

During layout checking, layout 210 is therefore identified as not matching any schematic, and each instance of layout 210 is automatically exploded for flat checking without requiring any instance of layout 206 to be exploded. In this manner, a handful of exception cases with special layout needs met by layout 210 are exploded, but hierarchical checking is preserved for the majority of instances of cells corresponding to schematic 202 and utilizing the standard layout 206, allowing layout design to be checked only once instead of once for each instance. This provides faster checking and less memory than exploding all layout cell instances corresponding to schematic 202.

Although the cell name from schematic cell data 204 is employed to identify layout 206 as the "standard" layout design for schematic 202, any mechanism may be employed which permits differentiation of layout instances associated with a particular schematic cell from those layout instance which correspond to a schematic cell but which are not associated with any schematic cell in a manner identifiable to the layout checking functionality. Layout designs which are associated with a schematic cell may then be checked hierarchically, with internal checking performed for only one instance, while layout designs not associated with any schematic cell are exploded and checked flat.

Figure 3:
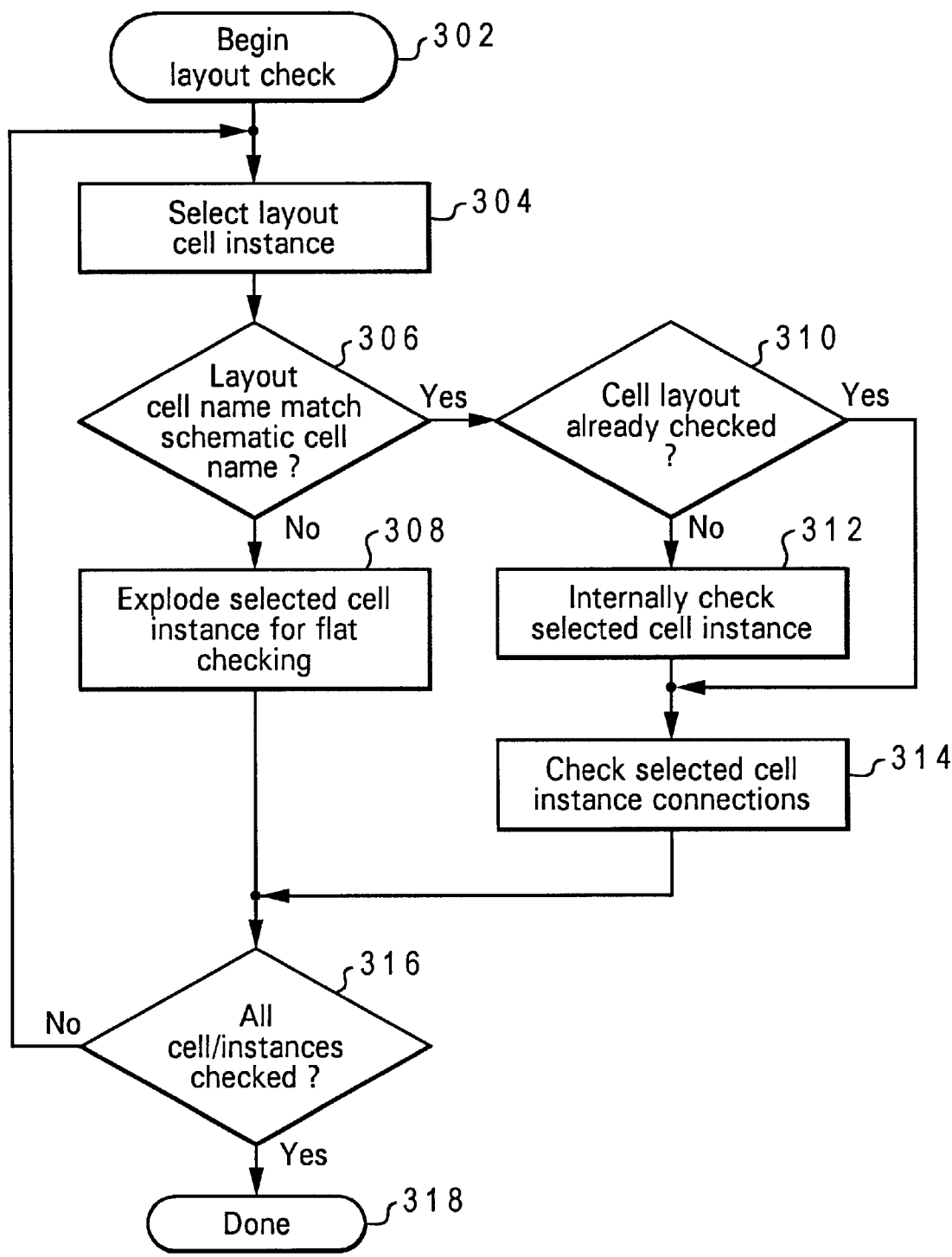
FIG. 3 depicts a high level flowchart for a process of checking integrated circuit cell layouts in accordance with a preferred embodiment of the present invention.

With reference now to FIG. 3, a high level flowchart for a process of checking integrated circuit cell layouts in accordance with a preferred embodiment of the present invention is depicted. The process begins at step 302, which depicts cell layout design checking being started. The process first passes to step 304, which illustrates selection of a layout design for checking, and then passes to step 306, which depicts a determination of whether the layout cell name matches any schematic cell name (or, alternatively, a layout cell name within a list of corresponding layout cells associated with a schematic cell).

If the layout cell name for the selected layout cell instance does not match a schematic cell name, the process proceeds to step 308, which illustrates exploding the selected layout cell instance for flat checking. If the layout cell name does match a schematic cell name, however, the process proceeds instead to step 310, which depicts a determination of whether the layout cell design for the selected layout cell instance has already been checked.

If the layout design for the selected layout cell instance has not already been checked, the process proceeds first to step 312, which illustrates checking the selected layout cell instance internally down to the lowest level, and then passes to step 314. If the layout design for the selected layout cell instance has already been checked, the process proceeds instead directly to step 314, which depicts checking the connections of the selected layout cell instance to neighboring cells. The process then passes to step 316, which illustrates a determination of whether all layout cell instances within the integrated circuit design have been checked. If not, the process returns to step 304 to select another layout cell instance for checking. If so, however, the process proceeds instead to step 318, which depicts the process ending.

The present invention allows hierarchical checking of cell layouts even where a layout design is not associated with a previously defined schematic. A single instance of a layout design associated with a checked and tested schematic circuit is internally checked, with all remaining instances being checked only for proper connection. Layout connection is thus faster and consumes less memory. Only layout designs which are not named identically to a corresponding schematic circuit cell are exploded and checked flat.

It is important to note that while the present invention has been described in the context of a fully functional data processing system and/or network, those skilled in the art will appreciate that the mechanism of the present invention is capable of being distributed in the form of a computer usable medium of instructions in a variety of forms, and that the present invention applies equally regardless of the particular type of signal bearing medium used to actually carry out the distribution. Examples of computer usable mediums include: nonvolatile, hard-coded type mediums such as read only memories (ROMs) or erasable, electrically programmable read only memories (EEPROMs), recordable type mediums such as floppy disks, hard disk drives and CD-ROMs, and transmission type mediums such as digital and analog communication links.

While the invention has been particularly shown and described with reference to a preferred embodiment, it will be understood by those skilled in the art that various changes in form and detail may be made therein without departing from the spirit and scope of the invention.

What is claimed is:

1. A method of checking an integrated circuit design, comprising:

defining a schematic for a portion of the integrated circuit design;

defining a first layout corresponding to the schematic, the first layout having a layout cell name matching a schematic cell name for the schematic;

defining a second layout corresponding to the schematic, the second layout having a layout cell name differing from the schematic cell name; and during layout checking of the integrated circuit design,
checking a first instance of the first layout for compliance with applicable design rules and for proper connection to neighboring cells,
checking each subsequent instance of the first layout only for proper connection to neighboring cells, and
responsive to being unable to identify a schematic corresponding to the second layout, exploding each instance of the second layout to a next lower level for flat checking.

2. The method of claim 1, wherein the step of defining a schematic for a portion of the integrated circuit design further comprises:

setting a unique schematic cell name for the schematic.

3. The method of claim 1, wherein the step of defining a first layout corresponding to the schematic further comprises:

setting a unique layout cell name for the first layout.

4. The method of claim 1, wherein the step of defining a second layout corresponding to the schematic further comprises:

associating a list of layout cell names corresponding to the schematic with schematic cell data for the schematic.

5. The method of claim 4, further comprising:

determining that a layout cell name for the second layout does not match any layout cell name within the list; and responsive to determining that a layout cell name for the second layout does not match any layout cell name within the list, exploding each instance of the second layout to a next lower level for flat checking.

6. The method of claim 4, further comprising:

setting a layout cell name for the second layout which does not match any layout cell name within the list and, during checking, exploding each instance of the second layout; or setting a layout cell name for the second layout which matches a layout cell name within the list and, during checking,
checking a first instance of the second layout for compliance with applicable design rules and for proper connection to neighboring cells,
checking each subsequent instance of the second layout only for proper connection to neighboring cells.

7. The method of claim 1, further comprising:

after exploding each instance of the second layout, checking each instance of the second layout.

8. A system for checking an integrated circuit design, comprising:
- means for defining a schematic for a portion of the integrated circuit design;
- means for defining a first layout corresponding to the schematic, the first layout having a layout cell name matching a schematic cell name for the schematic;
- means for defining a second layout corresponding to the schematic, the second layout having a layout cell name differing from the schematic cell name; and
- means operative during layout checking of the integrated circuit design for
  - checking a first instance of the first layout for compliance with applicable design rules and for proper connection to neighboring cells,
  - checking each subsequent instance of the first layout only for proper connection to neighboring cells, and
  - responsive to being unable to identify a schematic corresponding to the second layout, exploding each instance of the second layout to a next higher level for flat checking.

9. The system of claim 8, wherein the means for defining a schematic for a portion of the integrated circuit design further comprises:
- means for setting a unique schematic cell name for the schematic.

10. The system of claim 8, wherein the means for defining a first layout corresponding to the schematic further comprises: a first layout corresponding to the schematic further comprises:
- means for setting a unique layout cell name for the first layout.

11. The system of claim 8, wherein the means for defining a second layout corresponding to the schematic further comprises:
- means for associating a list of layout cell names corresponding to the schematic with schematic cell data for the schematic.

12. The system of claim 11, further comprising:
- means for determining that a layout cell name for the second layout does not match any layout cell name within the list; and
- means, responsive to determining that a layout cell name for the second layout does not match any layout cell name within the list, for exploding each instance of the second layout to a next lower level for flat checking.

13. The system of claim 11, further comprising:
- means for either
  - setting a layout cell name for the second layout which does not match any layout cell name within the list and, during checking, exploding each instance of the second layout, or
  - setting a layout cell name for the second layout which matches a layout cell name within the list and, during checking,
    - checking a first instance of the second layout for compliance with applicable design rules and for proper connection to neighboring cells, and
    - checking each subsequent instance of the second layout only for proper connection to neighboring cells.

14. The system of claim 8, further comprising:
- means for checking each instance of the second layout after exploding each instance of the second layout.

15. A computer program product within a computer usable medium for checking an integrated circuit design, comprising:
- instructions for defining a schematic for a portion of the integrated circuit design;
- instructions for defining a first layout corresponding to the schematic, the first layout having a layout cell name matching a schematic cell name for the schematic;
- instructions for defining a second layout corresponding to the schematic, the second layout having a layout cell name differing from the schematic cell name; and
- instructions operative during layout checking of the integrated circuit design for
  - checking a first instance of the first layout for compliance with applicable design rules and for proper connection to neighboring cells,
  - checking each subsequent instance of the first layout only for proper connection to neighboring cells, and
  - responsive to being unable to identify a schematic corresponding to the second layout, exploding each instance of the second layout to a next lower level for flat checking.

16. The computer program product of claim 15, wherein the instructions for defining a schematic for a portion of the integrated circuit design further comprises:
- instructions for setting a unique schematic cell name for the schematic.

17. The computer program product of claim 15, wherein the instructions for defining a first layout corresponding to the schematic further comprises:
- instructions for setting a unique layout cell name for the first layout.

18. The computer program product of claim 15, wherein the instructions for defining a second layout corresponding to the schematic further comprises:
- instructions for associating a list of layout cell names corresponding to the schematic with schematic cell data for the schematic.

19. The computer program product of claim 18, further comprising:
- instructions for determining that a layout cell name for the second layout does not match any layout cell name within the list; and
- instructions, responsive to determining that a layout cell name for the second layout does not match any layout cell name within the list, for exploding each instance of the second layout to a next lower level for flat checking.

20. The computer program product of claim 18, further comprising:
- instructions for either
  - setting a layout cell name for the second layout which does not match any layout cell name within the list and, during checking, exploding each instance of the second layout, or
  - setting a layout cell name for the second layout which matches a layout cell name within the list and, during checking,
    - checking a first instance of the second layout for compliance with applicable design rules and for proper connection to neighboring cells, and
    - checking each subsequent instance of the second layout only for proper connection to neighboring cells.

* * * * *

UNITED STATES PATENT AND TRADEMARK OFFICE
CERTIFICATE OF CORRECTION

PATENT NO.   : 6,567,958 B1
DATED        : May 20, 2003
INVENTOR(S)  : Runyou et al.

It is certified that error appears in the above-identified patent and that said Letters Patent is hereby corrected as shown below:

<u>Column 2,</u>
Line 19, delete "checking, the" and insert -- checking, increasing the --.
Line 45, delete "the cells" and insert -- the layout cells --.

<u>Column 7,</u>
Line 27, should read as follows:
10. The system of claim 8 wherein the means for defining a first layout corresponding to the schematic further comprises:
    means for setting a unique layout cell name for the first layout.

Signed and Sealed this

Second Day of March, 2004

JON W. DUDAS
*Acting Director of the United States Patent and Trademark Office*